(12) United States Patent
Hellgren et al.

(10) Patent No.: US 10,983,166 B2
(45) Date of Patent: Apr. 20, 2021

(54) ESTIMATION OF BATTERY PARAMETERS

(71) Applicants: Volvo Car Corporation, Gothenburg (SE); Volvo Truck Corporation, Gothenburg (SE)

(72) Inventors: Jonas Hellgren, Gothenburg (SE); Hannes Veen, Gothenburg (SE); Bjorn Fridholm, Gothenburg (SE)

(73) Assignees: VOLVO CAR CORPORATION, Gothenburg (SE); VOLVO TRUCK CORPORATION, Gothenburg (SE)

( * ) Notice: Subject to any disclaimer, the term of this patent is extended or adjusted under 35 U.S.C. 154(b) by 605 days.

(21) Appl. No.: 15/555,111

(22) PCT Filed: Mar. 5, 2015

(86) PCT No.: PCT/EP2015/054624
§ 371 (c)(1),
(2) Date: Sep. 1, 2017

(87) PCT Pub. No.: WO2016/138959
PCT Pub. Date: Sep. 9, 2016

(65) Prior Publication Data
US 2018/0045787 A1   Feb. 15, 2018

(51) Int. Cl.
*G01R 31/367* (2019.01)
*G01R 31/3828* (2019.01)
(Continued)

(52) U.S. Cl.
CPC .......... *G01R 31/367* (2019.01); *B60L 3/0046* (2013.01); *B60L 58/12* (2019.02);
(Continued)

(58) Field of Classification Search
CPC ........ B60L 3/0046; B60L 58/12; B60L 58/24; B60L 58/16; G01R 31/367; G01R 31/3828; G01R 31/36; H01M 10/486
See application file for complete search history.

(56) References Cited

U.S. PATENT DOCUMENTS

2003/0076109 A1   4/2003  Verbrugge et al.
2006/0111854 A1   5/2006  Plett
(Continued)

FOREIGN PATENT DOCUMENTS

CN   102088118   6/2011

OTHER PUBLICATIONS

Xiong et al., Open circuit voltage and state of charge online estimation for lithium ion batteries, Aug. 21-24, 2017, Elsevier Ltd., 9th International Conference on Applied Energy, Energy Procedia 142, pp. 1902-1907; 10.1016/j.egypro.2017.12.388 (Year: 2017).*
(Continued)

*Primary Examiner* — Mischita L Henson
(74) *Attorney, Agent, or Firm* — Harness, Dickey & Pierce, P.L.C.

(57) ABSTRACT

A system and a method are for estimating an operating parameter value of an energy storage device arranged to provide power for an electric or hybrid vehicle. In an embodiment, the method includes determining a first operating parameter value of the energy storage device at a first time; establishing a reference operating parameter value from pre-determined experimental data relating the operating parameter to a time related parameter; and based on the reference operating parameter value and the first operating parameter value, recursively calculating a second operating parameter value of the energy storage device at a second time subsequent to the first time. The recursive calculation includes a tuning parameter for modifying a
(Continued)

portion of the reference operating parameter value to be included in the second operating parameter value.

16 Claims, 6 Drawing Sheets

(51) Int. Cl.
    *B60L 58/12*     (2019.01)
    *G01R 31/36*     (2020.01)
    *B60L 3/00*     (2019.01)
    *H01M 10/48*     (2006.01)

(52) U.S. Cl.
    CPC .......... *G01R 31/36* (2013.01); *G01R 31/3828* (2019.01); *H01M 10/486* (2013.01)

(56) References Cited

U.S. PATENT DOCUMENTS

| | | | |
|---|---|---|---|
| 2009/0302855 A1* | 12/2009 | Lin | B60L 58/10 324/432 |
| 2012/0235483 A1* | 9/2012 | Rigby | H01M 10/633 307/29 |
| 2012/0290235 A1* | 11/2012 | Schaefer | H01M 10/4257 702/63 |
| 2013/0300204 A1* | 11/2013 | Partovi | H02J 7/00302 307/104 |
| 2014/0132214 A1 | 5/2014 | Katanoda | |
| 2014/0249226 A1 | 9/2014 | Bobotas et al. | |
| 2015/0231985 A1* | 8/2015 | Li | G01R 31/382 320/134 |

OTHER PUBLICATIONS

Wang et al., Open circuit voltage and state of charge relationship functional optimization for the working state monitoring of the aerial lithium-ion battery pack, Oct. 10, 2018, Elsevier Ltd., Journal of Cleaner Production, vol. 198, pp. 1090-1104; https://doi.org/10.1016/j.jclepro.2018.07.030 (Year: 2018).*
He et al., Online model-based estimation of state-of-charge and open-circuit voltage of lithium-ion batteries in electric vehicles, 2012, Energy, Elsevier, vol. 39(1), pp. 310-318. (Year: 2012).*
Moo et al., State-of-Charge Estimation with Open-Circuit-Voltage for Lead-Acid Batteries, 2007, IEEE, pp. 758-762 (Year: 2007).*
Chinese Office Action dated May 8, 2019.
International Search Report PCT/ISA/210 for International Application No. PCT/EP2015/054624 dated Nov. 11, 2015.
Written Opinion of the International Searching Authority PCT/ISA/237 for International Application No. PCT/EP2015/054624 dated Nov. 11, 2015.
International Preliminary Report on Patentability Application No. PCT/EP2015/054624 dated Jun. 20, 2017.

* cited by examiner

ESTIMATION OF BATTERY PARAMETERS

FIELD OF THE INVENTION

The present invention relates to a method and a system for estimating an operating parameter value of an energy storage device arranged to power propulsion for an electric or hybrid vehicle.

BACKGROUND

Electric and hybrid vehicles have recently become a more common sight on roads worldwide. They have one thing in common and that is they all require a large and powerful rechargeable energy storage, for example a rechargeable battery. Such rechargeable batteries have a limited runtime every time it is recharged and a user typically has a way of monitoring an estimated currently available power and/or energy of the battery.

In order to secure safety, reliability and performance of e.g. an electric vehicle, it is important to monitor the state of charge of the energy storage device. The available power or other operation conditions of the battery such as for example state of charge (SoC) are typically estimated using a model since they are difficult to measure directly. A common type of battery model comprises an equivalent circuit model through which current-voltage characteristics may be obtained for the model battery. Algorithms are used together with the model and typically needs inputs relating to the battery, for example the capacity and impedance of the battery cells of the battery. However, these inputs change as the battery ages, which make the estimations more complicated. Furthermore, it is important that the inputs to the algorithms are accurate in order to avoid drift in the estimations of e.g. state of charge.

One example of a method for estimating battery pack system model parameters is disclosed by U.S. Pat. No. 7,315,789 in which a battery cell model and a recursive formula are used.

However, the complexity of estimating e.g. state of charge increases when taking into account both the battery parameters and the aging of the battery. It would be desirable to in an efficient way include both the model parameters and the ageing of the battery in the estimation in order to increase the accuracy of the estimated e.g. capacity.

SUMMARY OF THE INVENTION

In view of the above, it is a general object of the present invention to provide a more robust method and a system for determining operating parameter values of an energy storage device. It is a further objective of the invention to provide an on-line method for determining operating parameter values of an energy storage device.

According to a first aspect it is therefore provided a method for estimating an operating parameter value of an energy storage device arranged to provide propulsion for an electric or hybrid vehicle, the method comprises:
  determining a first operating parameter value of the energy storage device at a first time;
  establishing a reference operating parameter value from pre-determined experimental data relating the operating parameter to a time related parameter,
  based on the reference operating parameter value and the first operating parameter value, recursively calculating a second operating parameter value of the energy storage device at a second time subsequent to the first time,
  wherein, the recursive calculation comprises a tuning parameter for modifying a portion of the reference operating parameter value to be included in the second operating parameter value.

The present invention is based on the realization that a more robust method for determining an operating parameter value of an energy storage device is possible by allowing a recursively estimated operating parameter value to include a portion of a reference determined from experimental data. In other words, when calculating a new updated operating parameter value (i.e. the second operating parameter value), the new operating parameter value is not only based on the previously determined operating parameter value in the recursive calculation, but also on predetermined experimental data. This way, due to the tuning parameter together with the reference operating parameter value which effectively forces the new operating parameter value to not deviate too far from the reference, the recursive calculation may at least partly be prevented from diverging in an unreasonable way. Furthermore, if an operating parameter value deviates far from the reference, the tuning parameter may be tuned to prevent diverging of the second operating parameter value. In addition, unexpected behavior or the energy storage device at cell, module, and pack level may be detected. For example, an unexpected behavior may be due to a malfunction due to e.g. electrolyte leakage.

The method is a recursive method where the second (subsequent) operating parameter value is based at least partly on a first (previous) operating parameter value.

The operating parameter may for example be an energy storage capacity or an impedance (e.g. resistance or capacitance) of the energy storage device.

The recursive calculation may for example be a recursive least square calculation or a Kalman filter algorithm.

The time related parameter may be time itself or usage history such as e.g. number of cycles of usage or a more complex model of battery aging, such as e.g. weighted ampere-hour models.

According to an embodiment of the invention, the tuning parameter may further be implemented to tune a portion of the first operating parameter value to be included in the second operating parameter value. In other words, the tuning parameter is adapted to tune both a portion of the reference operating parameter value to be included in the second operating parameter value and a portion of the previously determined first operating parameter value. This enables an efficient way of increasing the robustness of the calculation of the second operating parameter value.

According to an embodiment of the invention, the method may further comprise:
  determining a difference between the first operating parameter value and a respective reference operating parameter value,
  wherein if the difference exceeds a limit value, modifying the tuning parameter in order to reduce the difference. In other words, the tuning parameter may be tuned if it is determined that the first operating parameter value deviates more than a limit value from the reference operating parameter value. The limit value may for example be about 2%, 3%, 4%, 5%, 10%, 11%, 15%, or 50% i.e. if the first operating parameter value deviates more than about 2%, 3%, 4%, 5%, 10%, 11%, 15%, or 50% from the reference operating parameter value, the tuning parameter may be modified such as to decrease the deviation. The magnitude of the limit may depend on the type of operating parameter. Thereby, the robustness or the accuracy of the method may be at least partly controlled.

According to yet another embodiment of the invention, the pre-determined experimental data may be determined from measurements of operating parameter trajectories of a plurality of energy storage devices. In other words, previously measured data of the operating parameter from hundreds or even thousands of energy storage devices may be used to obtain the experimental data. For example, the reference operating parameter may be a reference capacity versus time or versus cycle number of the energy storage device. Another example of the reference operating parameter is the accumulated electrical current through the energy storage device, for example given as the accumulated ampere-hour throughput of the energy storage device from the first day the energy storage device is used to the present time. Alternatively, or additionally, the reference operating parameter is given by accumulated wattage-hour (Wh) throughput of the energy storage device from the first day the energy storage device is used to the present time. Moreover, the temperature of the energy storage device affects the operating parameter (e.g. capacity or resistance), thus the temperature of the energy storage device which operating parameters is estimated, may be monitored and matched with a reference operating parameter corresponding to that temperature, in other words, for different temperatures there may be different reference parameter values. For example, at a first temperature there may be a first reference parameter value, and a second temperature there may be a second reference parameter value. Furthermore, the reference parameter value may also change with the accumulated wattage- and/or ampere-hour throughput. The energy storage devices from which the experimental data is obtained are advantageously of similar type as the energy storage device for which the operating parameter value is estimated. However, experimental data may be extrapolated from other types of energy storage devices.

According to an embodiment of the invention, the second operating parameter value ($\theta_i$) may be recursively calculated according to a formula comprising:

$$\hat{\theta}_i = (1-\beta)\hat{\theta}_{i-1} + K_i \varepsilon_i + \beta \theta_i^*$$

where $0 \leq \beta < 1$ is the tuning parameter, $\theta_i^*$ is the reference operating parameter value, $\theta_{i-1}$ is the first operating parameter value, $\theta_i$ is the second operating parameter value, $\varepsilon_i$ is a residual (between expected and measured operating parameter value), and $K_i$ is a gain factor.

Furthermore, the formula may further comprise:

$$K_i = P_{i-1}\varphi_i(\lambda_i + \varphi_i^T P_{i-1}\varphi_i)^{-1}$$
$$W_i = (I - K_i\varphi_i^T)P_{i-1}$$
$$P_i = \begin{cases} W_i/\lambda_i, & \operatorname{tr}(W_i/\lambda_i) \leq C \\ W_i, & \text{otherwise} \end{cases},$$

where $P_i$ is a covariance of the operating parameter value $\theta_i$, I is the identity matrix, $\varphi_i$ is a regressor in the recursive algorithm, $\lambda_i$ is a forgetting factor, and C is a tuning constant. Thus, the formula for recursively calculating the second operating parameter value may be a recursive least square (RLS) algorithm. The parameter $\lambda_i$ is a forgetting factor. The forgetting factor may be in the form of a trimming parameter and has a value in the range of 0 to 1, preferably close to 1 (e.g. 0.90-0.99). The forgetting factor gives different weights to estimated parameters in different iterations of the recursive formula. For example a smaller weight may be given to an estimated parameter obtained at a time before a second estimation obtained more recently. Thus a more recent estimation is given a larger weight. Alternatively, the recursive algorithm may comprise a Kalman filter. For example, the Kalman filter algorithm may take the form:

$$P_{k|k-1} = P_{k-1|k-1} + Q_k$$

$$K_k = P_{k|k-1}\varphi_k^T(\varphi_k P_{k|k-1}\varphi_k^T + R_k)^{-1}$$

$$\hat{\theta}_k = \hat{\theta}_{k-1} + K_k(y_k - \varphi_k^T\hat{\theta}_{k-1})$$

$$P_{k|k} = P_{k|k-1} - K_k\varphi_k P_{k|k-1}$$

where P is a matrix comprising the covariances between different operating parameter values and the variances of the estimated operating parameter values, K is a Kalman gain (similar to the above gain factor in the RLS algorithm), $\varphi_i$ is a regressor, $R_k$ is a matrix comprising trim parameters of the Kalman filter, and $y_k$ is the present estimate of the operating parameter value. Generally, a Kalman filter as such is well known in the art.

In accordance with the invention, the operating parameter may be a capacity of a battery, or the operating parameter may be an impedance of the battery. In case of impedance, the operating parameter may be a parameter of an equivalent circuit model of a battery cell of the battery. For example, such an operating parameter may be an internal resistance $R_0$, or the resistive part $R_1$ or the capacitance $C_1$ of an RC-circuit of the equivalent circuit model.

The operating parameter may for example be capacity of the energy storage device. In this case, according to an embodiment, the method may further comprise the steps of:

measuring a first open circuit voltage of the energy storage device;

measuring a second open circuit voltage of the energy storage device;

estimating a first state of charge of the energy storage device and a second state of charge of the energy storage device from a predetermined relationship between open circuit voltage and state of charge of the energy storage device; and calculating a change in state of charge from the difference between the first state of charge and the second state of charge, wherein the change in state of charge is used as an input in the recursive calculation.

The relationship between the open circuit voltage and the state of charge of the energy storage device may be experimentally determined. When the energy storage device is in a relaxed state, (e.g. not during use) an open circuit voltage is measured and from the predetermined relationship, a state of charge may be found. It is advantageous to use measurements of open circuit voltage instead of a modeled open circuit voltage since it separates the determination of the capacity from the determination of the state of charge which reduces interrelated feedback error between the two determinations.

The method may further comprise: comparing the change in state of charge to a threshold; wherein, only if the change in state of charge is larger than the threshold, performing the recursive calculation of a second operating parameter value being a second capacity. This may advantageously discard estimations with too high levels of noise. For example, if the difference in state of charge is close to the noise levels of the measurement, a reliable estimate of the capacity may be difficult to obtain; therefore in that case, the capacity is not updated. This may occur for example if the energy storage device was not used during driving of the vehicle or if the energy storage device was only used to a limited extent, or during long drives without rests when an error of a determined current adds up in an integration operation.

Furthermore, if the operating parameter is a capacity of the energy storage device, the method may further comprise: determining the total amount of electrical current withdrawn from the energy storage device from a first time when the first operating parameter value was determined to a second time when the second operating parameter value is determined, wherein the total amount of current is used as an input in the recursive calculation.

According to a second aspect of the present invention there is provided a system for determining an operating parameter value of an energy storage device arranged in an electric or hybrid vehicle, the system comprises:

an electric current sensor for measuring an electric current through the energy storage device;

a voltage sensor for measuring a voltage of the energy storage device;

a control unit arranged to receive an electric current measurement from the electric current sensor; and a memory storage connected to the control unit, the memory storage having stored pre-determined experimental data comprising a reference operating parameter value of the energy storage device, wherein the control unit is configured to:

determine a first operating parameter value of the energy storage device;

establish a reference operating parameter value from the pre-determined experimental data, based on the reference operating parameter value the first operating parameter value, the electric current measurement received from the electric current sensor and on the measured voltage received from the voltage sensor, recursively calculate a second operating parameter value of the energy storage device, wherein, the recursive calculation comprises a tuning parameter for tuning a portion of the reference operating parameter value to be included in the second operating parameter value.

The control unit is preferably a micro processor or any other type of computing device. The control unit may comprise a computer readable medium which may be any type of memory device, including one of a removable nonvolatile/volatile random access memory, a hard disk drive, a floppy disk, a CD-ROM, a DVD-ROM, a USB memory, an SD memory card, or a similar computer readable medium known in the art.

The sensors may be configured to measure e.g. a respective voltage or current from the energy storage device, a voltage or current from individual energy storage cells of the energy storage device. There may further be sensors for measuring a temperature of the energy storage device, a temperature of individual energy storage cells, the temperature of a coolant (e.g. a liquid coolant) used for cooling the energy storage device (or cells), cell balancing current (a current used for balancing the state of charge of different cells of the energy storage device), or whether contactors are closed such that the power may be drawn from the energy storage device, etc.

A temperature sensor may for example be arranged to measure a temperature of the energy storage device, wherein the control unit is configured to establish the reference operating parameter at least partly depending on the measured temperature.

The system may advantageously comprise the energy storage device.

Furthermore, the system may advantageously be used for monitoring an energy storage device, such as a rechargeable battery, of an electric or hybrid vehicle. The system may thus advantageously be arranged in the vehicle. However, the control unit of the system may be arranged elsewhere, outside the vehicle.

Further effects and features of this second aspect of the present invention are largely analogous to those described above in connection with the first aspect of the invention.

Further features of, and advantages with, the present invention will become apparent when studying the appended claim and the following description. The skilled person realizes that different features of the present invention may be combined to create embodiments other than those described in the following, without departing from the scope of the present invention.

BRIEF DESCRIPTION OF DRAWINGS

These and other aspects of the present invention will now be described in more detail, with reference to the appended drawings showing a currently preferred embodiments of the invention, wherein.

DETAILED DESCRIPTION OF EMBODIMENTS OF THE INVENTION

In the following description, the present invention is mainly described with reference to an energy storage device arranged in an electric or hybrid vehicle in the form of a car. However, the invention may be applied to any type of electric vehicle such as a truck, a fork lift, a boat, etc. Furthermore, in the description, a method for capacity estimation is described; however, the methods are equally applicable to other parameters. For example, the method is applicable to parameters such as resistance and capacitance of an equivalent circuit model of an energy storage device.

Figure 1:
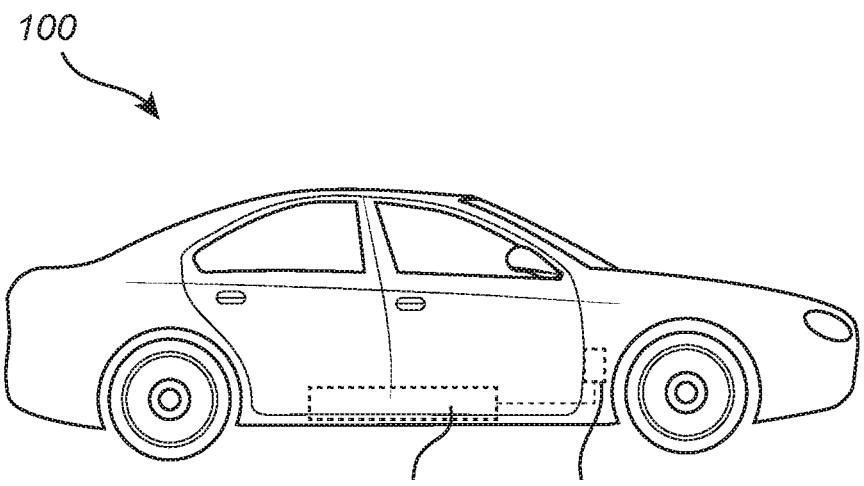
FIG. 1 illustrates an example of an application for an embodiment of the invention.

FIG. 1 illustrates an example application for embodiments of the invention. In FIG. 1 there is shown a vehicle 100 in the form of a hybrid or electric car 100 comprising a rechargeable battery 102. In the vehicle 100 there is further a battery management system 104 for controlling the rechargeable battery 102 and monitoring the operation and status of the battery 102. The system 200 according to the invention may be part of the battery management system 104 or may be a separate system. The rechargeable battery 102 may be a Li-ion battery.

Figure 2:
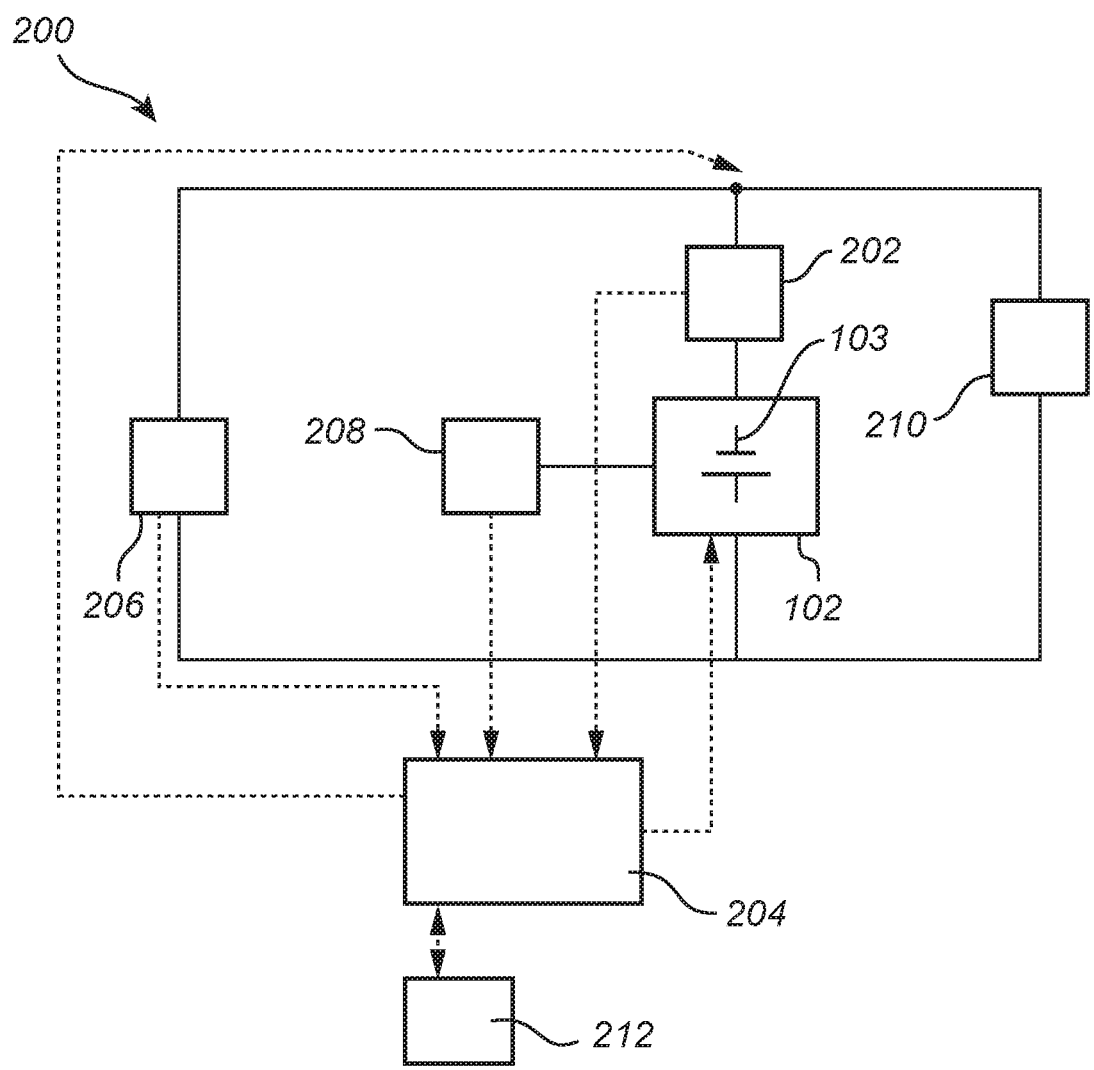
FIG. 2 schematically shows a system according to an example embodiment of the invention.

FIG. 2 schematically illustrates an example system 200 according to an embodiment of the invention. In FIG. 2, the system 200 comprises an electric current sensor 202, a voltage sensor 206, a temperature sensor 208, and a control unit 204 which may be in the form of a processor 204 connected to the sensors 202, 206, 208, such that the processor 204 may receive signals from the sensors 202, 206, 208. For example, the signals from the electric current sensor 202 may comprise electric current data of the battery 102 measured by the electric current sensor 202. The battery 102 may comprises several battery cells 103 (only one is shown in the drawing) which may be Li-ion cells. Naturally, there may be more than one voltage or current sensor and more than one temperature sensor if there are several battery cells. The processor 204 may be part of the battery management system 104, but may also be a processor external to the battery management system 104. Both the voltage sensor 206 and the temperature sensor 208 are connected to the processor 204 and may provide battery voltage data and temperature data respectively to the processor 204. The temperature sensor 208 may measure the temperature of an individual cell 103 of the battery 102. The battery 102 may be connected to a load 210 which may be an electric motor 210 of the vehicle for providing propulsion to the vehicle. Thus, the battery 102 is configured to power the electric motor 210. The processor 204 may therefore be configured to control the amount of power that the load 210 can use. Thus, the processor 204 may provide information to the load 210 regarding the amount of power the load 210 may use. The system may further comprise additional components not shown in the drawings, for example an AC/DC-converter between the battery 102 and the load 210.

Furthermore, the control unit 204 is in communication with a memory storage device 212 (e.g. a computer readable medium) configured to store data. The storage device 212 has stored reference operating parameter ($\theta^*$) data accessible to the control unit 204. The control unit 204 is configured to determine a first operating parameter value ($\theta_{i-1}$) of the battery 102 (or battery cell 103). Furthermore, the control unit 204 establishes a reference operating parameter value ($\theta_i^*$) from the pre-determined experimental data stored in the storage device 212. Based on the reference operating parameter value ($\theta_i^*$), the first operating parameter value ($\theta_{i-1}$), the electric current measurement received from the electric current sensor 202, and the voltage measurement received from the voltage sensor 206, the control unit 204 recursively calculates a second operating parameter value ($\theta_i$) of the battery 102. Furthermore, the recursive calculation comprises a tuning parameter ($\beta$) for tuning a portion of the reference operating parameter value ($\theta_i^*$) to be included in the second operating parameter value ($\theta_i$).

Figure 3:
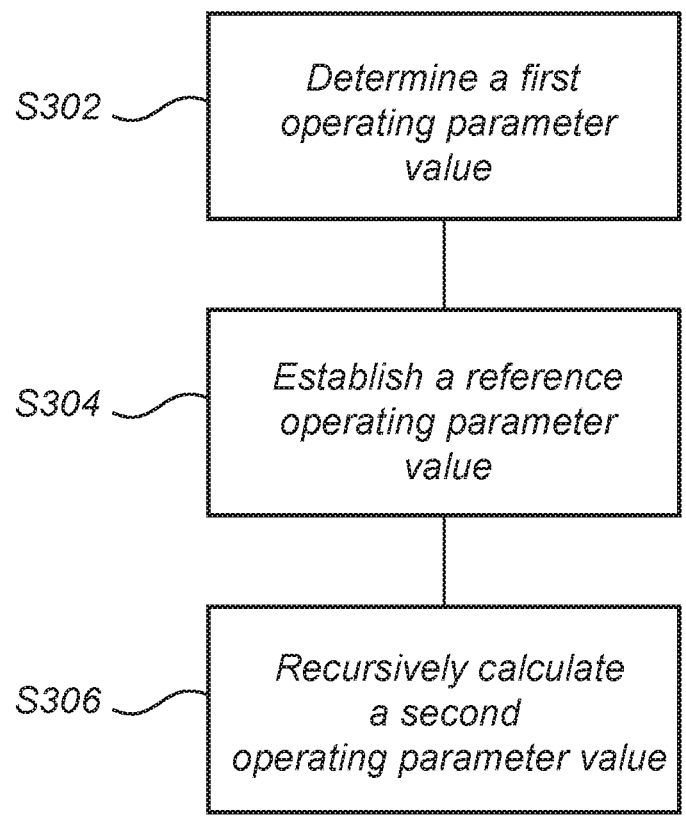
FIG. 3 is a flow-chart showing the steps according to an example embodiment of the invention.

FIG. 3 is a flow-chart of the steps of an example method according to an embodiment of the invention. In a first step S302, a first operating parameter value ($\theta_{i-1}$) is determined. The first operating parameter value may be determined from a previous step in the method, or if the method was initialized with this first step, the first operating parameter value may be determined from a calculation based on a change in state of charge and coulomb counting described below. For example, the method may be initialized at a predetermined time at a predetermined operating parameter value which is used in the proceeding calculations. In a second step S304, a reference operating parameter value ($\theta_i^*$) is established. The reference operating parameter value ($\theta_i^*$) is based on predetermined experimental data relating the operating parameter (i.e. the set of $\theta$) to time or cycle number, i.e. to the amount of usage. In step S306, a second operating parameter value ($\theta_i$) is recursively calculated based on the first operating parameter value ($\theta_{i-1}$) and the reference operating parameter value ($\theta_i^*$). The calculation of the second operating parameter value ($\theta_i$) includes using a tuning parameter 1 which modifies the portion of the reference operating parameter value ($\theta_i^*$) to be included in the calculation of the second operating parameter value ($\theta_i$). Thus, the tuning parameter may determine the portion of the reference operating parameter value ($\theta_i^*$) in the calculation. The operating parameter ($\theta$) may be a capacity of the energy storage device 102. Thus, the method described in FIG. 3 may be used for estimating the capacity of the energy storage device 102. The recursive calculation may be a recursive least square (RLS) algorithm given by:

$$\hat{\theta}_i = (1-\beta)\hat{\theta}_{i-1} + K_i \varepsilon_i + \beta \theta_i^*$$

$$K_i = P_{i-1}\varphi_i(\lambda_i + \varphi_i^T P_{i-1}\varphi_i)^{-1}$$

$$W_i = (I - K_i\varphi_i^T)P_{i-1}$$

$$P_i = \begin{cases} W_i/\lambda_i, & \operatorname{tr}(W_i/\lambda_i) \leq C \\ W_i, & \text{otherwise} \end{cases},$$

where $0 \leq \beta < 1$ is the tuning parameter, $\theta_i^*$ is the reference operating parameter value, $\theta_{i-1}$ is the first operating parameter value, $\theta_i$ is the second operating parameter value, $\varepsilon_i$ is a residual (between expected and measured operating parameter value), $K_i$ is a gain factor, $P_i$ is a covariance of the operating parameter $\theta_i$, I is the identity matrix, $\varphi_i$ is a regressor, e.g. difference in state of charge for the capacity estimation or current for the impedance estimation, $\lambda_i$ is a forgetting factor, and C is a constant. W is only an intermediate term which simplifies the understanding of the subsequent steps in the algorithm.

Figure 4:
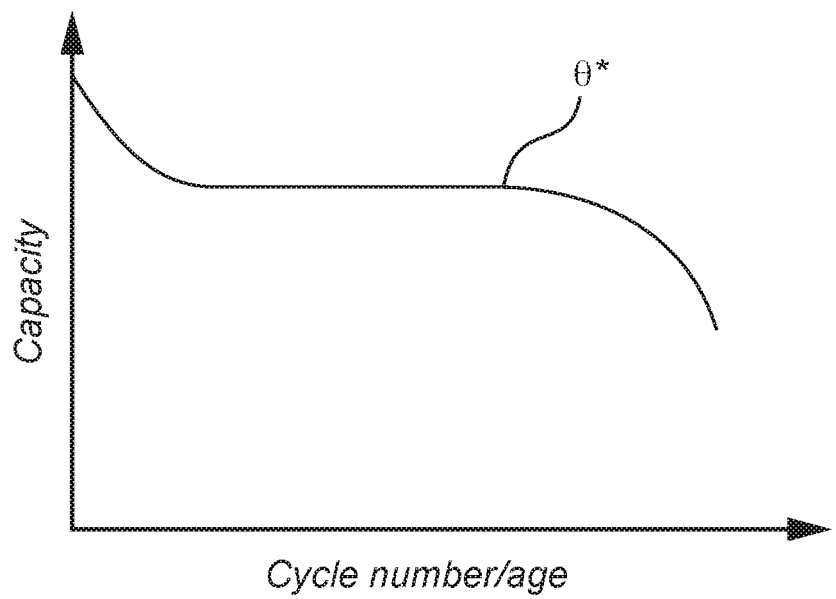
FIG. 4 shows an example reference trace.

FIG. 4 illustrates an example of experimentally determined capacity versus cycle number (the cycle number is naturally related to the age of the battery). The capacity data shown in FIG. 4 is an example of reference data $\theta^*$ used for establishing the reference operating parameter value $\theta_i^*$, in the case of FIG. 4, the reference operating parameter $\theta^*$ is a reference capacity fade versus cycle number of usage. One cycle comprises a discharge and a charge cycle of the energy storage device 102. The reference data shown in FIG. 4 may be determined from experimental measurements on a plurality of energy storage devices (e.g. batteries). Thus, the reference data $\theta^*$ may be the average of experimental measurements on a plurality of energy storage devices.

Figure 5:
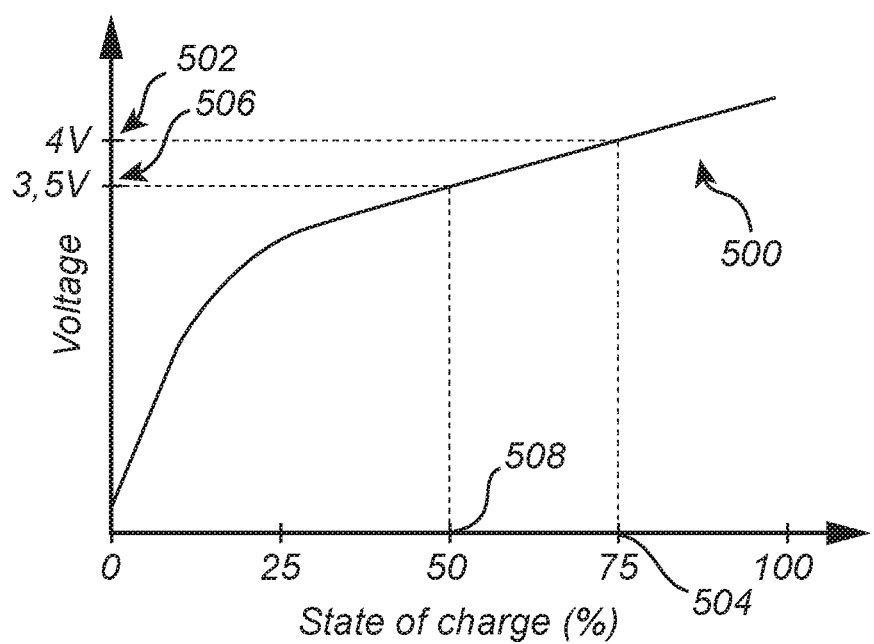
FIG. 5 shows an example voltage versus state of charge relation for an energy storage device.

FIG. 5 shows an example of open circuit voltage versus state of charge 500 for a battery 102. Naturally, the open circuit voltage is low for low state of charge and high for a high state of charge. The example open circuit voltage versus state of charge is used for the estimation of the capacity and is measured on a battery in a relaxed state, thus some time after usage such that e.g. temperature and voltage fluctuations have settled. For example, when the battery is in a relaxed state, the voltage of the battery may have settled at or at least close to the open circuit voltage level.

Next, a description of capacity determination of a battery (e.g. a Li-ion battery) in a vehicle follows. Firstly, with the vehicle not running, a voltage 502 (see FIG. 5) of the battery is measured. From data 500 of open circuit voltage versus state of charge, for example as shown in FIG. 5, a first state of charge 504 ($z(t_0)$) at time $t_0$, may be determined. Note that the measurement of the voltage is done in a relaxed state (explained with reference to FIG. 7) of the battery. During operation of the vehicle using the battery, the total used capacity may ideally be determined by "counting" (i.e. "coulomb counting") the amount of charge ($Q_{cc}$) used during the time of usage. This may be done using the formula:

$$Q_{cc} = \eta \Sigma_{k=t_0}^{t_i} i_k \Delta t,$$

where $i_k$ is the measured current, $\Delta t$ is the sampling time, t denotes time and $\eta$ is a constant close to one. At a second time, after the usage of the vehicle a second voltage 506 of the battery is measured in a relaxed state. Again from data of open circuit voltage versus state of charge, for example as shown in FIG. 5, a second state of charge $z(t_1)$ 508 (at time $t_1$) is determined. Note that the second state of charge $z(t_1)$ is determined from a second measurement of open circuit voltage versus state of charge. The capacity ($Q_{cell}$) of the battery may now be estimated from the change in state of charge and from the Coulomb counting by:

$$\hat{Q}_{cell} = \frac{Q_{cc}}{z(t_1) - z(t_0)}.$$

The determination of the total used capacity ($Q_{cc}$) may be inherently noisy and may also contain other errors. Furthermore, the determination of the capacity ($Q_{cell}$) depends on the state of charge ($z(t_0)$ and $z(t_1)$) which in turn depends on the capacity. This may lead to additional errors from the interrelated dependency. In this case, the state of charge ($z(t_0)$ and $z(t_1)$) are determined from a measured relationship such as the one shown in FIG. 5, thereby significantly reducing this error contribution. Thus, the state of charge ($z(t_0)$ and $z(t_1)$) is based on measurements of open circuit voltage on a relaxed battery rather than on modeled open circuit voltage, thereby separating the capacity estimation from the state of charge estimation. An updated estimation of the capacity taking the residual into account may be obtained using a recursive least square (RLS) algorithm. The RLS algorithm used was described above but is repeated here, and is given by:

$$\hat{\theta}_i = (1 - \beta)\hat{\theta}_{i-1} + K_i \varepsilon_i + \beta \theta_i^*$$
$$K_i = P_{i-1}\varphi_i(\lambda_i + \varphi_i^T P_{i-1}\varphi_i)^{-1}$$
$$W_i = (I - K_i\varphi_i^T)P_{i-1}$$
$$P_i = \begin{cases} W_i/\lambda_i, & \mathrm{tr}(W_i/\lambda_i) \leq C \\ W_i, & \text{otherwise} \end{cases},$$

where $0 \leq \beta < 1$ is the tuning parameter, $\theta_i^*$ is the reference operating parameter value, $\theta_{i-1}$ is the first operating parameter value, $\theta_i$ is the second operating parameter value, $\varepsilon_i$ is a residual (between measured and expected operating parameter value), $K_i$ is a gain factor, $P_i$ is a covariance of the operating parameter value $\theta_i$, I is the unity matrix, $\varphi_i$ is the regressor e.g. difference in state of charge for the capacity estimation or difference in current for the impedance estimation, $\lambda_i$ is a forgetting factor, and C is a constant. The constant C is adjusted such that the covariance $P_i$ is small. In this case of capacity, $\hat{\theta} = \hat{Q}_{cell}$, and $\varepsilon_i = Q_{cc} - \theta_i \Delta z$, where $\Delta z$ is the difference in state of charge ($z(t_i) - z(t_{i-1})$).

With the tuning parameter $\beta$, it is possible to tune the new update (e.g. the second operating parameter value) such that a portion of the updated capacity is based on experimentally determined data from a reference set of data. This forces the estimate to be within certain bounds and thus makes the estimation more robust. For example, to illustrate the function of the tuning parameter, assume that $\beta = 0.5$, then half of the new estimate of the capacity $\theta_i$ is based on the reference $\theta_i^*$ and half on the previous (i.e. first) capacity $\theta_i$. If it is found that the first estimate $\theta_{i-1}$ of the capacity deviates more than a limit value from the reference $\theta_i^*$, then the tuning parameter $\beta$ may be adjusted such that to reduce the deviation in the next iteration of the algorithm, or by repeating the iteration with the adjusted tuning parameter $\beta$. The limit value depends on several inputs, such as the age of the energy storage device, the type of energy storage device (e.g. chemical parameters), application of the energy storage device. However, as an example, the limit value may be allowed to in the range of 5% to 50% from the reference operating parameter value. Rewriting the above formula in this way:

$$\hat{\theta}_i = \hat{\theta}_{i-1} + K_i \varepsilon_i + \beta(\theta_i^* - \theta_{i-1})$$

illustrates in a simpler way the impact of the difference between the reference $\theta_i^*$ and the first estimate $\theta_{i-1}$ and the tuning parameter $\beta$ on the second estimate $\theta_i$. The tuning parameter $\beta$ may be regarded as an non-linear amplification. Furthermore, a notice regarding the deviation may be transmitted by the control unit to a user of the vehicle.

Figure 6:
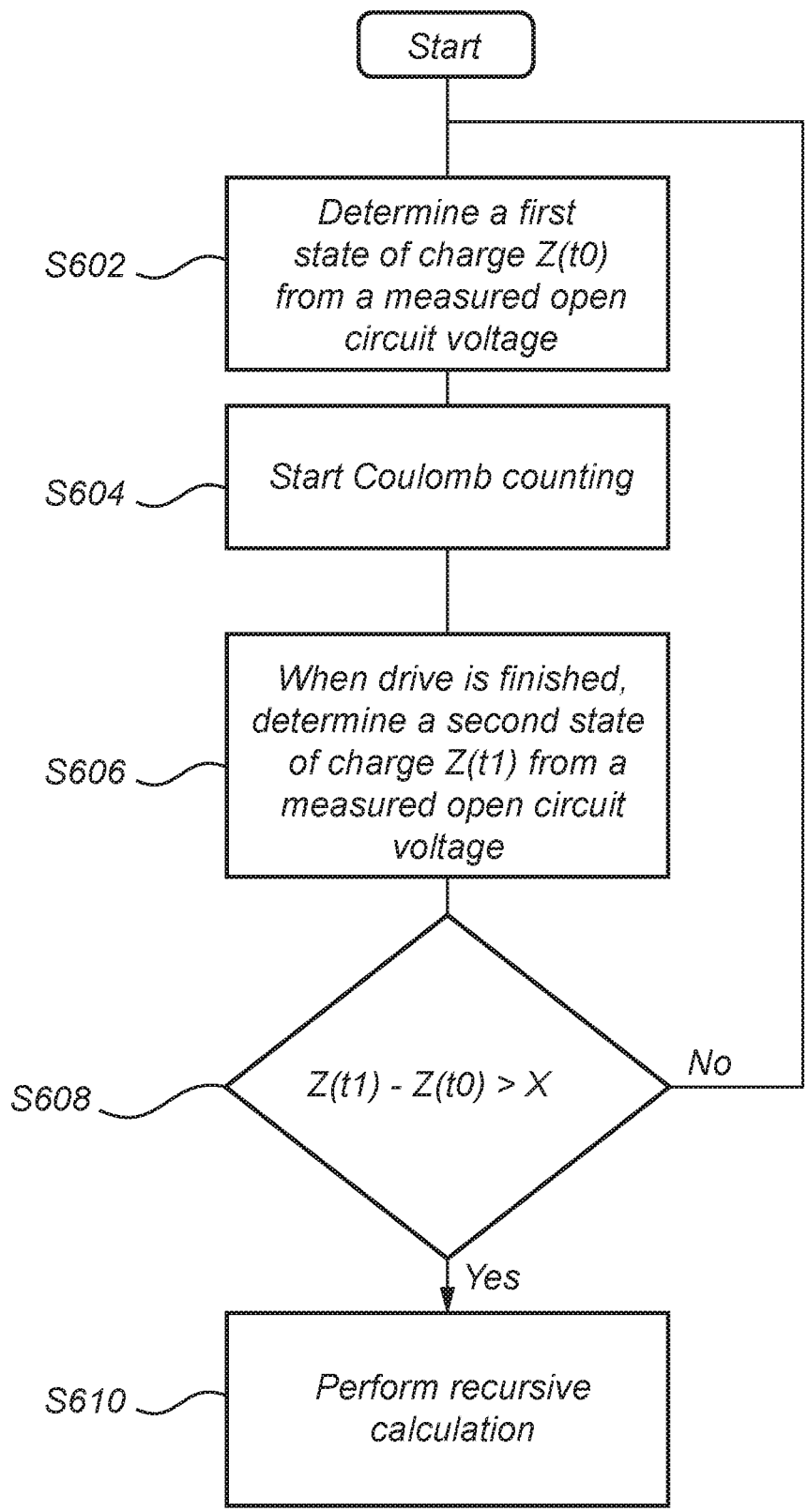
FIG. 6 provides a flow-chart showing the steps according to an example embodiment of the invention.

FIG. 6 provides a flow-chart of method steps for determining a capacity of a battery according to an embodiment of the invention. In a first step S602 a first state of charge 504 ($z(t_0)$) is determined. The first stage of charge is determined by first measuring an open circuit voltage of the battery and then finding the state of charge from a measured relationship 500 (see FIG. 5) between open circuit voltage and state of charge. For example, the open circuit voltage is 4 volts (indicated by 502) the corresponding state of charge is 75% (indicated by 504) according to the example relationship 500 shown in FIG. 5. In a subsequent step S604, coulomb counting is started by the control unit 204 in the vehicle. The coulomb counting may be started as soon as the battery is being used after the first state of charge is determined. Coulomb counting is done by measuring the total electrical current withdrawn from the battery during a time window ($\Delta t$). Coulomb counting may be used to determine the parameter $Q_{cc}$. Subsequently, after driving of the vehicle is finished, or at least after usage (e.g. withdrawal of electrical current) of the battery is finished, a second state of charge 508 ($z(t_1)$) is determined in a similar manner as the first state of charge $z(t_0)$. Thus an open circuit voltage 506 is determined and a thereafter a corresponding state of charge 508 from the relationship 500. Subsequently S608, the difference between the first state of charge $z(t_0)$ and the second state of charge $z(t_1)$ is determined and compared to a threshold X. If the difference in state of charge is smaller than the threshold X, the method returns to step S602. In that case the signal-to-noise ratio of the difference is too small for an accurate estimation of capacity in the subsequent steps. Thus, the threshold may be the amount of noise in the measured capacity ($Q_{cc}$). If the difference in state of charge is larger than the threshold X, the method proceeds to perform S610 the recursive calculation of the capacity according the previously described algorithm. The threshold may be that the first state of charge $z(t_0)$ is at least 1%, 2%, 3%, 4%, 5%, or e.g. 10% (the list is non-exhaustive) larger than the second state of charge $z(t_1)$. Alternatively, the threshold may be that the second state of charge $z(t_1)$ is at least 1%, 2%, 3%, 4%, 5%, or e.g. 10% (the list is non-exhaustive) larger than the first state of charge $z(t_0)$.

Figure 7:
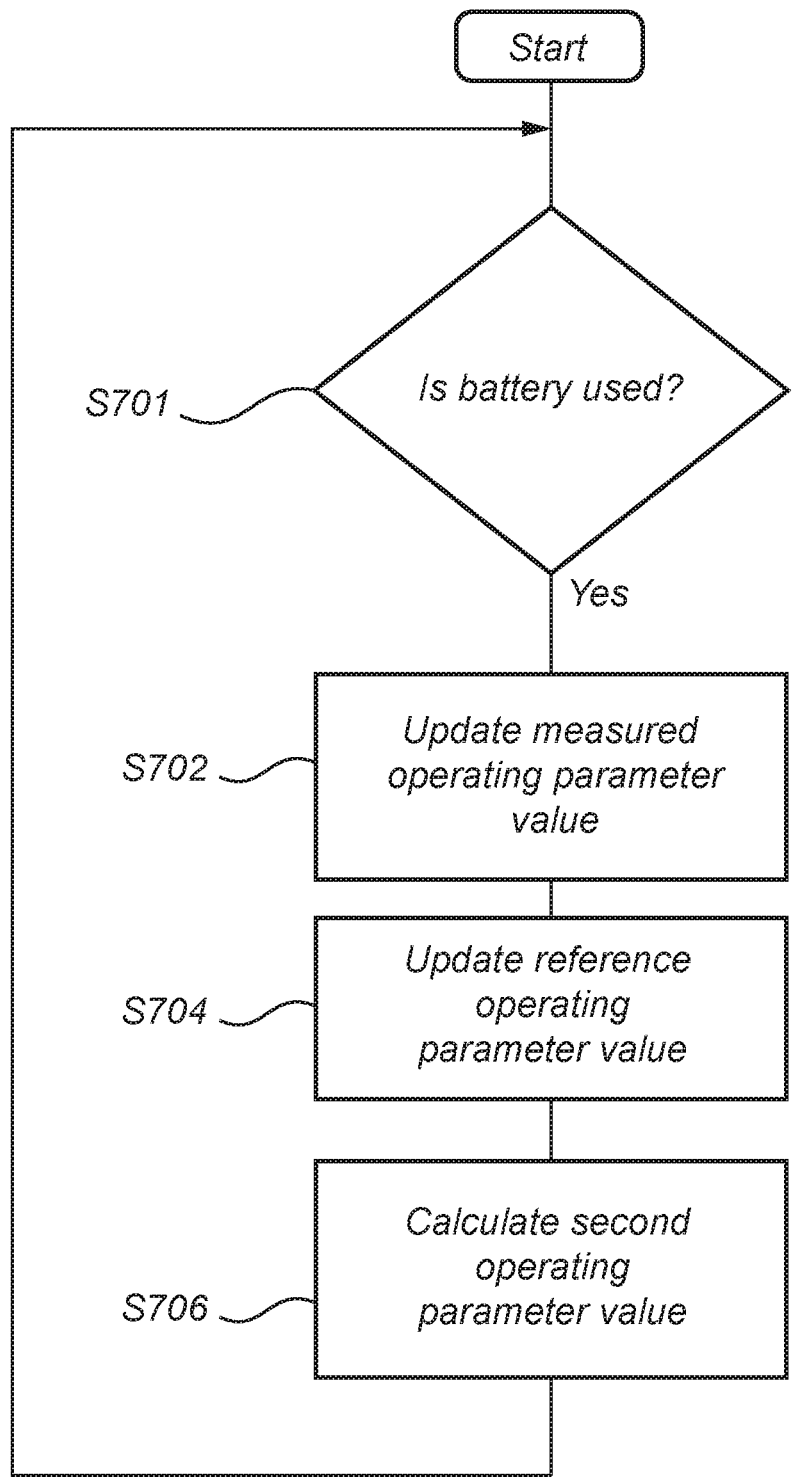
FIG. 7 provides a flow-chart showing the steps according to an example embodiment of the invention.

FIG. 7 provides a flow-chart of alternative or additional method steps to the steps described with reference to FIG. 3. Thus, it is described method steps for determining an operating parameter of a battery used to provide power for propulsion of a vehicle. If the battery is used S701, the method proceeds to subsequent step S702, in which a measured operating parameter value is determined, thereby a previously made measurement of the operating parameter value is updated. If the operating parameter is the capacity of the energy storage device, this measurement may be determined by using the Coulomb counting method described above, thus in the case of capacity being the operating parameter, the measured operating parameter value may be $Q_{cc}$. In a subsequent step S704, a reference operating parameter value $\theta_i^*$ is determined from predetermined experimental data, thereby a previously obtained reference operating parameter value is updated for the ongoing iteration of the method. The subsequent steps S704 and S706 may be performed after the present usage of the battery is finalized. Next, in step S706, a previously determined first operating parameter value ($\theta_{i-1}$) is used together with the measured operating parameter value (e.g. $Q_{cc}$) and the reference operating parameter value $\theta_i^*$ to update the operating parameter value by recursively calculating a second operating parameter value.

In addition to the steps described with reference to FIG. 3, the step S702 of measuring an operating parameter value may be included to the steps of FIG. 3, as described in FIG. 7 (step S702).

Figure 8:
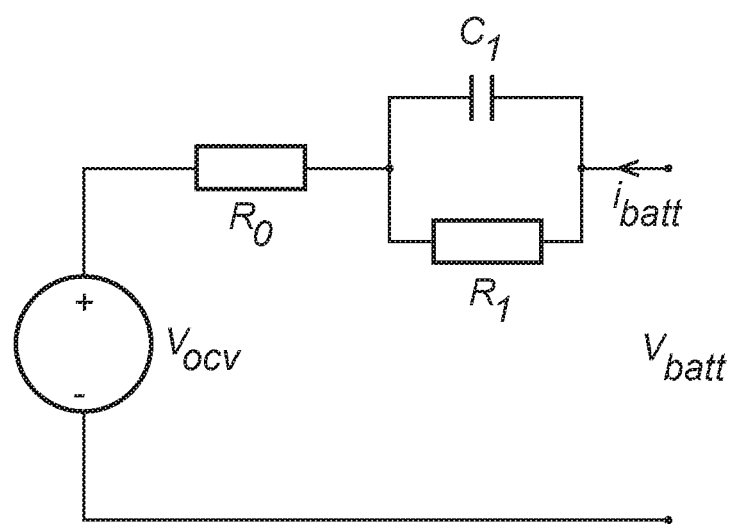
FIG. 8 schematically illustrates an equivalent circuit model of a battery cell.

FIG. 8 shows equivalent circuit model 800 of a battery cell. The equivalent circuit model 800 comprises the operating parameters: internal resistance $R_o$ and $R_1$, and capacitance $C_1$. As can be understood from the model 800 diagram $R_1$ and $C_1$ form a so-called RC-circuit. Furthermore, $i_{batt}$ denotes the electrical current through the battery, $V_{ocv}$ denotes the open circuit voltage of the battery, and $V_{batt}$ denotes the output voltage of the battery. In a fully relaxed state (thus, the dynamics in the RC-circuit are suppressed and the temperature stable at room temperature), $V_{ocv}=V_{batt}$.

In embodiments where the operating parameter is an impedance, for example a resistance of a battery cell of the battery, the recursive formula may be given by:

$$\hat{\theta}_i = (1-\beta)\hat{\theta}_{i-1} + K_i\varepsilon_i + \beta\theta_i^*$$
$$K_i = P_{i-1}\varphi_i(\lambda_i + \varphi_i^T P_{i-1}\varphi_i)^{-1}$$
$$W_i = (I - K_i\varphi_i^T)P_{i-1}$$
$$P_i = \begin{cases} W_i/\lambda_i, & \text{tr}(W_i/\lambda_i) \leq C \\ W_i, & \text{otherwise} \end{cases},$$

where $0\leq\beta<1$ is the tuning parameter, $\theta_i^*$ is the reference resistance, $\theta_{i-1}$ is the first resistance, $\theta_i$ is the second resistance, $\varepsilon_i$ is a residual (between measured resistance and expected), $K_i$ is a gain factor, $P_i$ is a covariance of the resistance $\theta_i$, I is the unity matrix, $\varphi_i$ is the regressor, $\lambda_i$ is a forgetting factor, and C is a constant. In this case of resistance, $\hat{\theta}=\hat{R}_o$, and $\varepsilon_i=\Delta v_{batt}-R_{i-1}\Delta i_{batt}$, where $\Delta v_{batt}$ and $\Delta i_{batt}$ is the difference in voltage and current respectively between before usage of the battery and after (similar to the difference in state of charge $\Delta z$ described previously).

Additionally, variations to the disclosed embodiments can be understood and effected by the skilled person in practicing the claimed invention, from a study of the drawings, the disclosure, and the appended claim. For example, recursive methods may be used other than the example algorithms show in the depicted embodiments, such as for example a Kalman filter algorithm.

In the claim, the word "comprising" does not exclude other elements or steps, and the indefinite article "a" or "an" does not exclude a plurality. The mere fact that certain measures are recited in mutually different dependent claim does not indicate that a combination of these measured cannot be used to advantage.

The invention claimed is:

1. A method, comprising:
    determining, by a control unit, a first operating parameter value of an energy storage device at a first time, wherein the operating parameter is a capacity of said energy storage device, wherein the energy storage device is arranged to provide power to an electric motor for propulsion for an electric or hybrid vehicle and wherein the energy storage device is a rechargeable battery;
    establishing, by the control unit, a reference operating parameter value from experimental data relating an operating parameter of the energy storage device to a time related parameter, wherein the reference operating parameter is a reference capacity fade versus time or versus cycle number of the energy storage device, and wherein the experimental data are stored on a memory storage device accessible to the control unit;
    recursively calculating, by the control unit and based on said established reference operating parameter value and said determined first operating parameter value, a second operating parameter value of the energy storage device at a second time, subsequent to the first time; and
    controlling, by the control unit, the amount of power that the electric motor can use based on the recursively calculated second operating parameter,
        said recursively calculating includes a tuning parameter, for modifying a portion of said established reference operating parameter value, to be included in the second operating parameter value, and
        wherein said experimental data is determined from measurements of operating parameter trajectories of a plurality of energy storage devices.

2. The method of claim 1, wherein said tuning parameter is further implemented to tune a portion of said determined first operating parameter value to be included in said second operating parameter value.

3. The method of claim 2, further comprising:
    determining a difference between said determined first operating parameter value and a respective reference operating parameter value, and
    modifying, in response to said difference exceeding a limit value, said tuning parameter to reduce said difference.

4. The method of claim 2, wherein said recursively calculating of the second operating parameter value ($\theta_i$) is performed according to a formula comprising:

$$\hat{\theta}_i=(1-\beta)\hat{\theta}_{i-1}+K_i\varepsilon_i+\beta\theta_i^*$$

where $0\leq\beta<1$ is the tuning parameter, $\theta_i^*$ is the reference operating parameter value, $\theta_{i-1}$ is the first operating parameter value, $\theta_i$ is the second operating parameter value, $\varepsilon_i$ is a residual, and $K_i$ is a gain factor.

5. The method of claim 4, said formula further comprises:

$$K_i = P_{i-1}\varphi_i(\lambda_i + \varphi_i^T P_{i-1}\varphi_i)^{-1}$$

$$W_i = (I - K_i\varphi_i^T)P_{i-1}$$

$$P_i = \begin{cases} W_i/\lambda_i, & tr(W_i/\lambda_i) \le C \\ W_i, & \text{otherwise,} \end{cases}$$

where $P_i$ is a covariance of the second operating parameter value $\theta_i$, I is an identity matrix, $\varphi_i$ is a regressor, $\lambda_i$ is a forgetting factor, and C is a constant.

6. The method of claim 1, further comprising:
determining a difference between said determined first operating parameter value and a respective reference operating parameter value, and
modifying, in response to said difference exceeding a limit value, said tuning parameter to reduce said difference.

7. The method of claim 1, wherein said recursively calculating of the second operating parameter value ($\theta_i$) is performed according to a formula comprising:

$$\hat{\theta}_i = (1-\beta)\hat{\theta}_{i-1} + K_i\varepsilon_i + \beta\theta_i^*$$

where $0 \le \beta < 1$ is the tuning parameter, $\theta_i^*$ is the reference operating parameter value, $\theta_{i-1}$ is the first operating parameter value, $\theta_i$ is the second operating parameter value, $\varepsilon_i$ is a residual, and $K_i$ is a gain factor.

8. The method of claim 7, said formula further comprises:

$$K_i = P_{i-1}\varphi_i(\lambda_i + \varphi_i^T P_{i-1}\varphi_i)^{-1}$$

$$W_i = (I - K_i\varphi_i^T)P_{i-1}$$

$$P_i = \begin{cases} W_i/\lambda_i, & tr(W_i/\lambda_i) \le C \\ W_i, & \text{otherwise,} \end{cases}$$

where $P_i$ is a covariance of the second operating parameter value $\theta_i$, I is an identity matrix, $\varphi_i$ is a regressor, $\lambda_i$ is a forgetting factor, and C is a constant.

9. The method of claim 1, wherein said method further comprises:
measuring a first open circuit voltage of said energy storage device;
measuring a second open circuit voltage of said energy storage device;
estimating a first state of charge of the energy storage device and a second state of charge of the energy storage device from a predetermined relationship between open circuit voltage and state of charge of said energy storage device; and
calculating a change in state of charge from a difference between said estimated first state of charge and said estimated second state of charge, wherein said calculated change in state of charge is used as an input in said recursively calculating.

10. The method of claim 9, further comprising:
comparing said calculated change in state of charge to a threshold; and
wherein, only in response to said comparing indicating said calculated change in state of charge being relatively larger than said threshold, performing said recursively calculating of the second operating parameter value being a second capacity of said energy storage device.

11. A system, comprising:
an electric current sensor to measure an electric current through an energy storage device arrangeable to provide power to an electric motor for propulsion in an electric or hybrid vehicle, wherein the energy storage device is a rechargeable battery;
a voltage sensor to measure a voltage of the energy storage device;
a control unit arranged to receive an electric current measurement from the electric current sensor; and
a memory storage connected to the control unit, said memory storage including stored experimental data including at least one reference operating parameter value of said energy storage device, wherein the reference operating parameter is a reference capacity fade versus time or versus cycle number of the energy storage device,
wherein said control unit is configured to:
determine a first operating parameter value of the energy storage device, wherein the operating parameter is a capacity of said energy storage device;
establish a reference operating parameter value from said stored experimental data;
recursively calculate a second operating parameter value of said energy storage device, based on said established reference operating parameter value, said determined first operating parameter value, a measurement of electric current received from the electric current sensor and a measurement of voltage received from said voltage sensor; and
control the amount of power that the electric motor can use based on the recursively calculated second operating parameter,
wherein, said recursively calculating includes a tuning parameter for tuning a portion of said established reference operating parameter value to be included in the second operating parameter value, and
wherein said experimental data is determined from measurements of operating parameter trajectories of a plurality of energy storage devices.

12. The system of claim 11, further comprising a temperature sensor arranged to measure a temperature of said energy storage device, wherein said control unit is configured to
establish said reference operating parameter at least partly depending on a measured temperature received from said temperature sensor.

13. A vehicle comprising the system of claim 12.

14. A vehicle comprising the system of claim 11.

15. The system of claim 11, further comprising a temperature sensor arranged to measure a temperature of said energy storage device, wherein said control unit is configured to establish said reference operating parameter at least partly depending on a measured temperature received from said temperature sensor.

16. A vehicle comprising the system of claim 15.

* * * * *